United States Patent
Rachakonda et al.

(10) Patent No.: US 10,269,232 B2
(45) Date of Patent: Apr. 23, 2019

(54) SYSTEM AND METHOD FOR HAZARDOUS VOLTAGE DETECTION IN ALL DIRECTIONS USING INTELLIGENT SENSORS INTEGRATED INTO AN ARTICLE OF SAFETY CLOTHING

(71) Applicant: Honeywell International Inc., Morris Plains, NJ (US)

(72) Inventors: Nagaraju Rachakonda, Hyderabad (IN); Ravi Kumar Avupati, Hyderabad (IN); Mehabube Rabbanee Shaik, Hyderabad (IN); Swapnil Gopal Patil, Thane (IN); Muneeswaran M, Srivilliputhur (IN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/773,439

(22) PCT Filed: Nov. 3, 2016

(86) PCT No.: PCT/US2016/060251
§ 371 (c)(1),
(2) Date: May 3, 2018

(87) PCT Pub. No.: WO2017/079389
PCT Pub. Date: May 11, 2017

(65) Prior Publication Data
US 2018/0315290 A1    Nov. 1, 2018

(30) Foreign Application Priority Data

Nov. 4, 2015  (IN) .......................... 3605/DEL/2015

(51) Int. Cl.
G08B 21/02 (2006.01)
G08B 21/18 (2006.01)
(Continued)

(52) U.S. Cl.
CPC ........... G08B 21/182 (2013.01); A41D 1/002 (2013.01); A41D 1/04 (2013.01); G01R 29/0814 (2013.01);
(Continued)

(58) Field of Classification Search
CPC .... G05D 1/0088; G05D 1/0276; G05D 1/021; G05D 1/0212; G05D 1/0214;
(Continued)

(56) References Cited

U.S. PATENT DOCUMENTS 5,973,602 A * 10/1999 Cole ................... A62B 17/003
                                                            2/93
5,984,757 A * 11/1999 Tsai ....................... A63H 13/12
                                                            335/219

(Continued)

FOREIGN PATENT DOCUMENTS

| CA | 2617976 A1 | 7/2009 |
| WO | 2009158471 A1 | 12/2009 |

(Continued)

OTHER PUBLICATIONS

International Application No. PCT/US2016/060251, International Search Report, dated Mar. 31, 2017, 3 pages.
(Continued)

*Primary Examiner* — Daniel Previl
(74) *Attorney, Agent, or Firm* — Wick Phillips Gould & Martin, LLP

(57) ABSTRACT

An article of safety clothing that comprises sensors and an electronic module coupled to the sensors to detect at least one of ambient electric fields or electro-magnetic fields above a predefined threshold, whereby a wearer of the vest may be alerted to electrical hazards.

20 Claims, 6 Drawing Sheets

(51) Int. Cl.
*G08B 5/36* (2006.01)
*A41D 1/00* (2018.01)
*A41D 1/04* (2006.01)
*G01R 29/08* (2006.01)
*G08B 25/10* (2006.01)

(52) U.S. Cl.
CPC ............... *G08B 5/36* (2013.01); *G08B 21/02* (2013.01); *G08B 25/10* (2013.01)

(58) Field of Classification Search
CPC .............. G05D 1/0274; G05D 1/0285; B60W 2540/04; B60W 2550/142; B60W 2550/20; B60W 2720/10; B60W 40/04; B60W 50/10; B60W 30/18; B60W 30/181; B60W 10/04; B60W 10/20; B60W 2420/40; B60W 2420/52; B60W 2420/54; B60W 2710/20; B60W 40/076; H04W 4/021; H04W 4/06; H04W 4/08; H04W 84/08; H04W 92/02; B60K 2350/1036; B60K 37/06; F16P 3/142; F16P 3/147; G01S 19/13; G06K 9/00288; G06K 9/00335; G06K 9/00771; G06K 9/4652; G06K 9/627; G06Q 10/06; G06Q 10/087; G06Q 10/10; G06Q 10/20; G06Q 20/10; G06Q 30/0222; G06Q 30/0283; G06Q 30/04; G06Q 30/0601; G06Q 40/00; G06Q 40/04; G06Q 40/12; G06Q 40/123; G06Q 40/125; G08B 21/02; H04N 7/188

USPC ... 340/573.1, 568.1, 571, 572.1, 572.6, 584, 340/693.5, 589, 588
See application file for complete search history.

(56) References Cited

U.S. PATENT DOCUMENTS

| | | | | |
|---|---|---|---|---|
| 9,579,060 | B1* | 2/2017 | Lisy | A61B 5/6803 |
| 2007/0120671 | A1* | 5/2007 | Carmichael | A62C 99/00 |
| | | | | 340/572.1 |
| 2011/0060215 | A1* | 3/2011 | Tupin, Jr. | A61B 5/0507 |
| | | | | 600/425 |
| 2011/0227748 | A1* | 9/2011 | Schaible | F16P 3/14 |
| | | | | 340/686.6 |
| 2014/0307076 | A1* | 10/2014 | Deutsch | G08B 21/02 |
| | | | | 348/77 |
| 2016/0063890 | A1* | 3/2016 | Sethi | G09B 5/06 |
| | | | | 434/236 |

FOREIGN PATENT DOCUMENTS

| | | |
|---|---|---|
| WO | 2015051039 A1 | 4/2015 |
| WO | 2017079389 A1 | 5/2017 |

OTHER PUBLICATIONS

International Application No. PCT/US2016/060251, Written Opinion of the International Searching Authority, dated Mar. 31, 2017, 6 pages.
International Application No. PCT/US2016/060251, International Preliminary Report on Patentability, dated May 17, 2018, 8 pages.

* cited by examiner

SYSTEM AND METHOD FOR HAZARDOUS VOLTAGE DETECTION IN ALL DIRECTIONS USING INTELLIGENT SENSORS INTEGRATED INTO AN ARTICLE OF SAFETY CLOTHING

CROSS-REFERENCE TO RELATED APPLICATIONS

The present application is the National Stage of International Application No. PCT/US2016/060251 filed on Nov. 3, 2016 and entitled "System and Method for Hazardous Voltage Detection in all Directions Using Intelligent Sensors Integrated into an Article of Safety Clothing," which claims priority to India Patent Application No. 3605/DEL/2015 filed on Nov. 4, 2015 and entitled "System and Method for Hazardous Voltage Detection in all Directions Using Intelligent Sensors Integrated into an Article of Safety Clothing," such that the present application claims priority to both listed related applications, both of which are incorporated herein by reference in their entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Workers such as electrical linemen and emergency responders may work under stressful conditions in the presence of high electrical voltages, for example in an electrical power generation plant, in an electrical power distribution station, or on an accident site. Under these conditions, the workers may be exposed to dangers of electrical shock that may injure or kill them. Safety may be increased by workers maintaining safe distances from electrical power sources. The safe distance may vary based on the strength of the electrical power source (i.e., based on the voltage of the electrical power source).

SUMMARY

In an embodiment, an article of safety clothing is disclosed. The article of safety clothing comprises sensors and an electronic module coupled to the sensors to detect at least one of ambient electric fields or electro-magnetic fields above a predefined threshold, whereby a wearer of the vest may be alerted to electrical hazards.

In an embodiment, an article of clothing providing detection of electrical hazard detection and alerting is provided. The article of clothing comprises a plurality of sensors and an electronic module communicatively coupled to the sensors. Each sensor is configured to interact with at least one of an electric field or an electromagnetic field, is coupled to the article of clothing, and is oriented to a different direction than that other sensors. The electronic module comprises at least one alerting device, a multiplexer to pass a signal from one sensor at a time, and a processor. The processor is configured to select sensor signals via the multiplexer, to analyze at least one of an amplitude of an electric field or an amplitude of an electromagnetic field incident on the selected sensor, to determine when at least one of the amplitude of the electric field exceeds a predefined electric field threshold or the electromagnetic field exceeds a predefined electromagnetic field threshold, and to activate the alerting device when one of the amplitude of the electric field exceeds the predefined electric field threshold or the amplitude of the electromagnetic field exceeds the predefined electromagnetic field, wherein the alerting device indicates the direction to which the sensor associated with the exceeding field is oriented.

In another embodiment, an article of clothing providing electrical hazard detection and alerting is disclosed. The article of clothing comprises four antennas and an electronic module communicatively coupled to the antennas. Each antenna is configured to interact with at least one of an electric field or an electromagnetic field, is coupled to the article of clothing, and is oriented to a different direction than that other antennas. The electronic module comprises an aural alerting device, a visual alerting device that is configured to indicate a direction of an electrical hazard relative to the orientation of the article of clothing, a multiplexer to pass a signal from one antenna at a time, and a processor. The processor is configured to select antenna signals via the multiplexer, to analyze at least one of an amplitude of an electric field or an amplitude of an electromagnetic field incident on the selected antenna, to determine when at least one of the amplitude of the electric field exceeds a predefined electric field threshold or the electromagnetic field exceeds a predefined electromagnetic field threshold, to activate the aural alerting device when one of the amplitude of the electric field exceeds the predefined electric field threshold or the amplitude of the electromagnetic field exceeds the predefined electromagnetic field, and to cause the visual alerting device to indicate the direction of the electrical hazard when one of the amplitude of the electric field exceeds the predefined electric field threshold or the amplitude of the electromagnetic field exceeds the predefined electromagnetic field.

In another embodiment, a method of detecting and alerting electrical hazard direction is disclosed. The method comprises selecting by a processor of an electronic module coupled to an article of clothing one of a plurality of sensors coupled to the article of clothing, wherein each sensor is oriented to detect at least one of electric fields or electromagnetic fields in a different direction from the other sensors, conditioning by the electronic module a signal received from the selected sensor, analyzing by the processor the conditioned signal, determining by the processor that a field incident on the selected sensor exceeds a predefined threshold, and causing by the processor an alerting device of the electronic module to present an alert indicating a direction of an electrical hazard relative to the orientation of the article of clothing.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
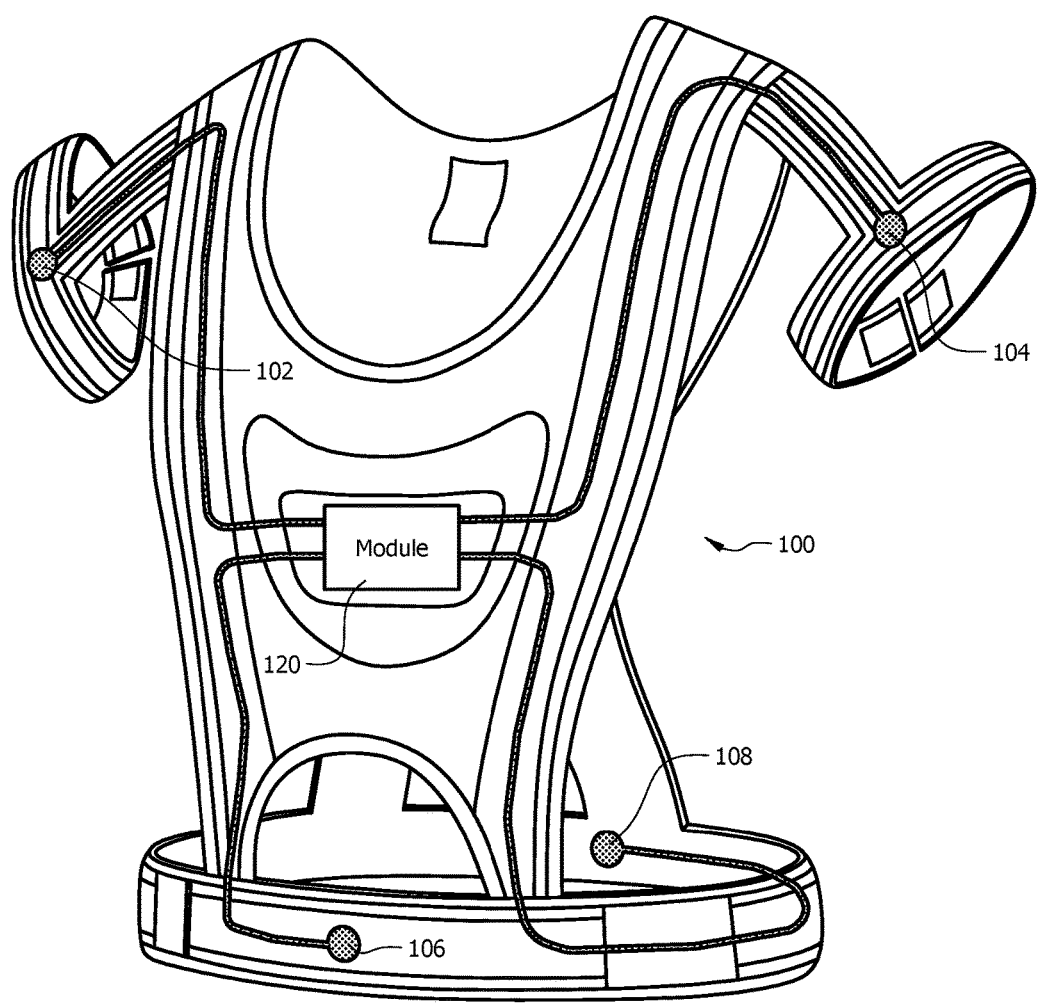
FIG. 1 is an illustration of a safety vest according to an embodiment of the disclosure.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The present disclosure teaches a safety vest, or other article of clothing, for use by workers to alert them of potentially dangerous electrical hazards in their work environment. For example, electrical linemen may work in environments that have high voltage power lines that may injure or even kill the linemen. If the lineman becomes immersed in a job or is otherwise distracted, the lineman may approach a high voltage electric line too closely and run the risk of harmful electric shock. Emergency responders, too, may sometimes work in accident scenes where they are exposed to dangerous electrical hazards. The safety vest taught herein can alert the workers to both the presence of a potentially dangerous electric field and indicate the direction of the electric field relative to the worker's body. Alternatively, or in addition, the safety vest taught herein can alert the workers to the presence of a potentially dangerous electromagnetic field and indicate the direction of the electromagnetic field relative to the worker's body. In an embodiment, it may be that it is the electric field that poses the physical danger to the worker's body but the electromagnetic field (e.g., a time varying electromagnetic field) associated with the electric field that is detected by the safety vest. Thus, in an embodiment, sensing the electromagnetic field may serve as a useful proxy for detecting the presence of the dangerous electric field.

The safety vest comprises a plurality of electrical field and/or electro-magnetic field sensors coupled to a processing/alerting electronic module. The electronic module selects an input from each of the sensors in turn, via a multiplexer, and determines whether the sensed field strength exceeds a predefined field strength threshold. If the field strength threshold is determined to be exceeded, the electronic module presents an alert. The alert presentation may comprise one or more of an audio alert, a visual alert, and a vibration alert. The electronic module may comprise a buzzer or speaker that can be commanded to generate an audible alert. The electronic module may comprise a light or light emitting diode(s) that can be commanded to generate a visible alert. The electronic module may comprise a vibration device that can be commanded to generate a vibration alert.

In an embodiment, the safety vest comprises a radio transceiver configured to communicate with a mobile communication device. The safety vest may transmit an alert event to the mobile communication device, and an application executing on the mobile communication device may present an alert to the worker. For example, a display window of the application on the mobile communication device may provide an illustration of a worker with a highlighted, illuminated, and/or flashing indication located where a corresponding sensor of the safety vest is located, e.g., a sensor that is providing an indication of a field strength that the electronic module determines to exceed the predefined threshold. The mobile communication device may vibrate when an alert event is received. The mobile communication device may sound an aural alert when an alert event is received. In an embodiment, the mobile communication device may log field strengths sensed by the sensors (as reported to the mobile communication device by the electronic module of the safety vest). The mobile communication device may transmit these logs to a monitoring station or data store in real-time or in periodic reports such as hourly reports, shift end reports, daily reports, or some other periodic term.

Turning now to FIG. 1, a safety vest 100 is described. In an embodiment, the safety vest 100 comprises a first sensor 102 in a right shoulder of the vest 100, a second sensor 104 in a left shoulder of the vest 100, a third sensor 106, in a waist front of the vest 100, and a fourth sensor 108 in a waist back of the vest 100. The vest 100 may have any convenient shape or style of vestment. In an embodiment, the vest 100 may incorporate high visibility elements such as high visibility stripes and/or fields.

The sensors 102, 104, 106, 108 are coupled to a processing/alerting electronic module 120, for example by wires that are woven into the material of vest 100, laminated into the material of the vest 100, adhered to the material of the vest, and/or secured by loops to the vest 100. The sensors 102, 104, 106, 108 are coupled to the vest 100. For example, the sensors 102, 104, 106, 108 may be sewn into a pocket of the vest 100, snapped to the vest 100, secured to the vest 100 by a loop, secured to the vest 100 by a Velcro attachment, or other attachment. The sensors 102, 104, 106, 108 may each be removable from the vest 100. For example, the sensors 102, 104, 106, 108 may be coupled to the wires by a removable connector, jack, plug, or socket. Likewise, the wires may be coupled to a connector that couples to the electronic module 120, and the electronic module 120 may be removable from the vest 100. By removing the electronic module 120, the vest 100 may be cleaned in conventional washing machines. In an embodiment, the sensors 102, 104, 106, 108 may also be removed before washing the vest 100.

While the description refers primarily to a safety vest, it is understood that the teachings of the present disclosure may advantageously be applied to other articles of clothing. For example, a fireman's coat may desirably be made with sensors and electronic module 120 as described herein. For example, trousers that incorporates sensors might couple to the electronic module 120 installed in the safety vest 120 (e.g., the worker would wear both the safety vest 120 and safety trousers) and provide further assistance and/or precision in detecting electric hazards.

While four sensors 102, 104, 106, 108 are illustrated in FIG. 1, it is understood that the vest 100 may comprise two sensors, three sensors, five sensors, or some greater number of sensors. In an embodiment, an additional sensor may be located proximate to a neck back of the vest 100 and/or an additional sensor may be located towards the heel of a safety trouser leg). The sensors 102, 104, 106, 108 may comprise antennas or probes. The antennas may comprise substantially flat, metal foil material. The antennas may be adhered to or laminated within a flexible printed circuit board structure. The antennas may be formed from one or more sheets of metal foil that has been worked to create an antenna structure. For example, two sheets of metal foil may be separated by a dielectric material and antenna structures formed on one of the sheets of metal, for example apertures to form one or an array of aperture antenna elements. Other antenna structures are contemplated by the present disclosure. The sensors 102, 104, 106, 108 may sense electro-magnetic fields as well as static electric fields.

Figure 2:
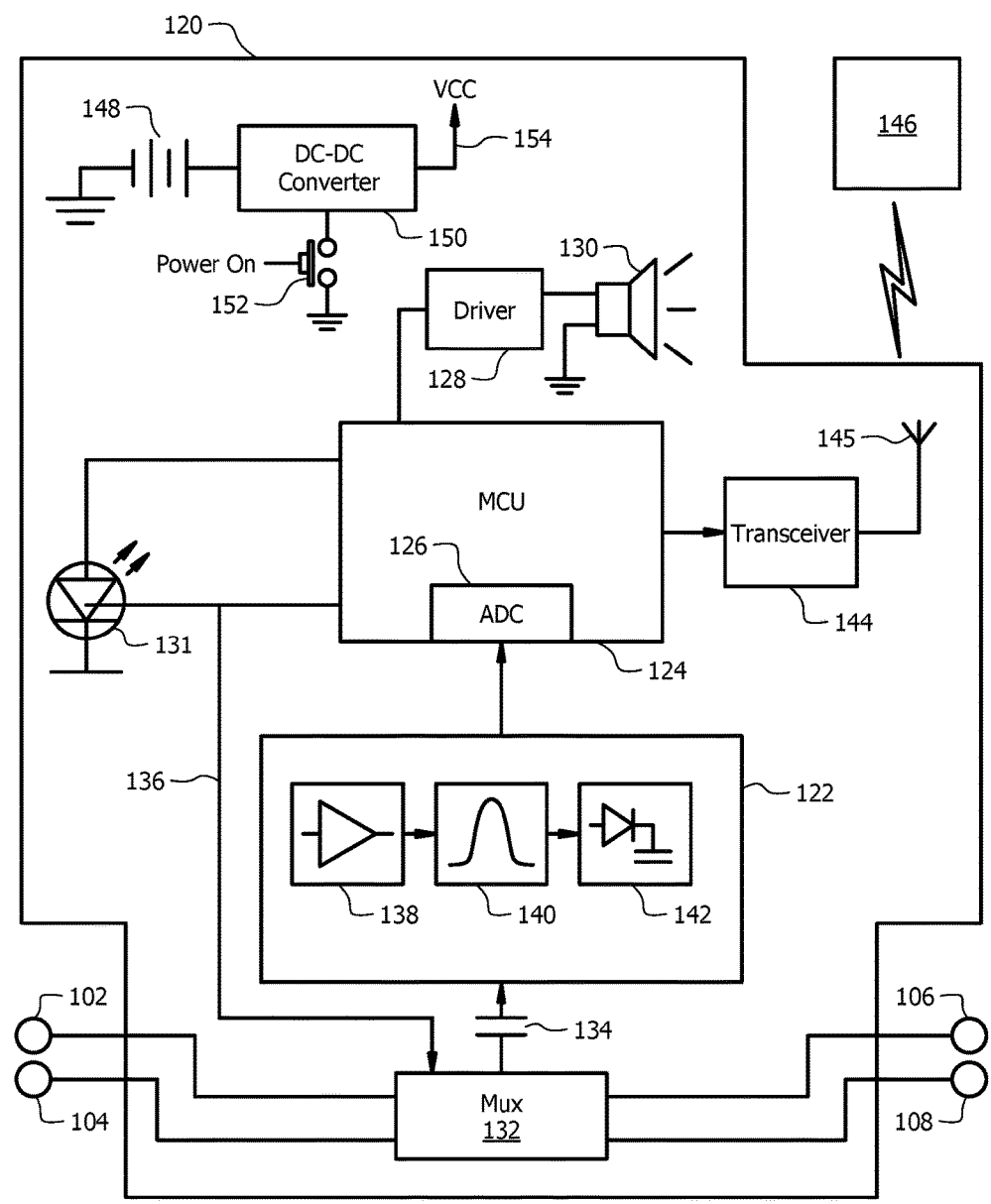
FIG. 2 is a block diagram of an electrical hazard detection system according to an embodiment of the disclosure.

Turning now to FIG. 2, further details of the electronic module 120 are described. In an embodiment, the electronic module 120 comprises a signal conditioning block 122, a microcontroller 124, an analog-to-digital converter 126, an audio driver component 128 and an audio alert device 130. It is understood that in other embodiments, the functionality attributed to the microcontroller 124 in the description herein may be provided by different logic processors, for example by any of a microprocessor, a digital signal processor, an application specific integrated circuit, a field programmable gate array, or a programmable logic device. The audio alert device 130 may be a speaker, a buzzer, or another audio device. The electronic module 120 further comprises a visual alert 131, a multiplexer 132, an optional coupling capacitor 134, and a multiplexer select line 136. The electronic module 120 further comprises an electric power circuit comprising a battery 148, a DC-DC converter 150, a power on switch 152, and the DC voltage Vcc 154. It is understood that the DC voltage Vcc 154 is supplied and routed to various components of the electronic module 120 as desired. In an embodiment, the electronic module 120 further comprises a radio transceiver 144 and associated antenna 145. In an embodiment, the radio transceiver 144 and antenna 145 may establish a wireless communication link with a mobile communication device 146.

The microcontroller 124 may execute logic or a program that is stored in the microcontroller 124 and/or in a memory device (not shown) coupled to the microcontroller 124. In response to executing the logic, the microcontroller 124 may select the multiplexer 132 to couple each of the sensors 102, 104, 106, 108 in turn (one at a time) to the signal conditioning block 122. The signal conditioning block 122 may comprise an amplifier 138, a bandpass filter 140, and a rectifier 142. A signal received from a sensor 102, 104, 106, 108 is first amplified by the amplifier 138, then the amplified signal is bandpass filtered to a frequency band of interest (e.g., with a center frequency of 50 Hz, a center frequency of 60 Hz, or of some other frequency associated with an anticipated electrical power source), and the bandpass filtered amplified signal is then rectified and smoothed by the rectifier 142 to produce a DC voltage that corresponds to an amplitude of an electric field and/or electro-magnetic field incident on the sensor selected by the multiplexer 132. The DC voltage produced by the signal conditioning block 122 is converted to a time sequence of digital values by the ADC 126.

The microcontroller 124 then monitors and/or analyzes the digital values to determine when the digital values exceed a predefined threshold value corresponding to a predefined field amplitude threshold. When the digital values exceed the predefined threshold, the microcontroller 124 generates an alert event and presents one or more alerts. For example, the microcontroller 124 may cause the audio device 130 to sound, to cause the visual alert 131 to illuminate, and/or to cause a vibrator device (not shown) of the electronic module 120 to mechanically vibrate. In an embodiment, the presentation may indicate which of the sensors 102, 104, 106, 108 is experiencing a strong electric field or strong electro-magnetic field at the time, thereby indicating to the worker the direction in which the electrical hazard lies, enabling the worker to avoid the hazard. In an embodiment, the electronic module 120 may comprise the same number of visual alerts 131 as sensors 102, 104, 106, 108 and the visual alert 131 corresponding to the sensor experiencing a strong field may illuminate. The microcontroller 124 may further transmit the alert event via the radio transceiver 144 and antenna 145 to the mobile communication device 146. The mobile communication device 146 may present an alert also, for example on a display of the mobile communication device 146, using a speaker of the device 146, or using a vibrator of the device 146. The mobile communication device 146 may be a mobile smart phone, a personal digital assistant (PDA), a media player, a wearable computer, or a headset computer.

In an embodiment, the microcontroller 124 may log readings of field strength, stamped with the identity of the associated sensor 102, 104, 106, 108 and stamped with a time and date. The microcontroller 124 may periodically transmit these logs to the mobile communication device 146, for example hourly, at the end of a work shift, daily, or on some other periodic time interval. The mobile communication device 146 may in turn transmit the logs to a server and/or data store (not shown) for storage and analysis. In an embodiment, the stored logs may be audited and/or analyzed to show compliance with regulatory policies of exposures to electric fields and/or electro-magnetic fields in the work place. In an embodiment, the microcontroller 124 supports a self-test mode that the worker can initiate from a control (not shown) on the electronic module 120. For example, the self-test mode can present alerts so the worker knows what alerts are functional and which are not.

Figure 3:
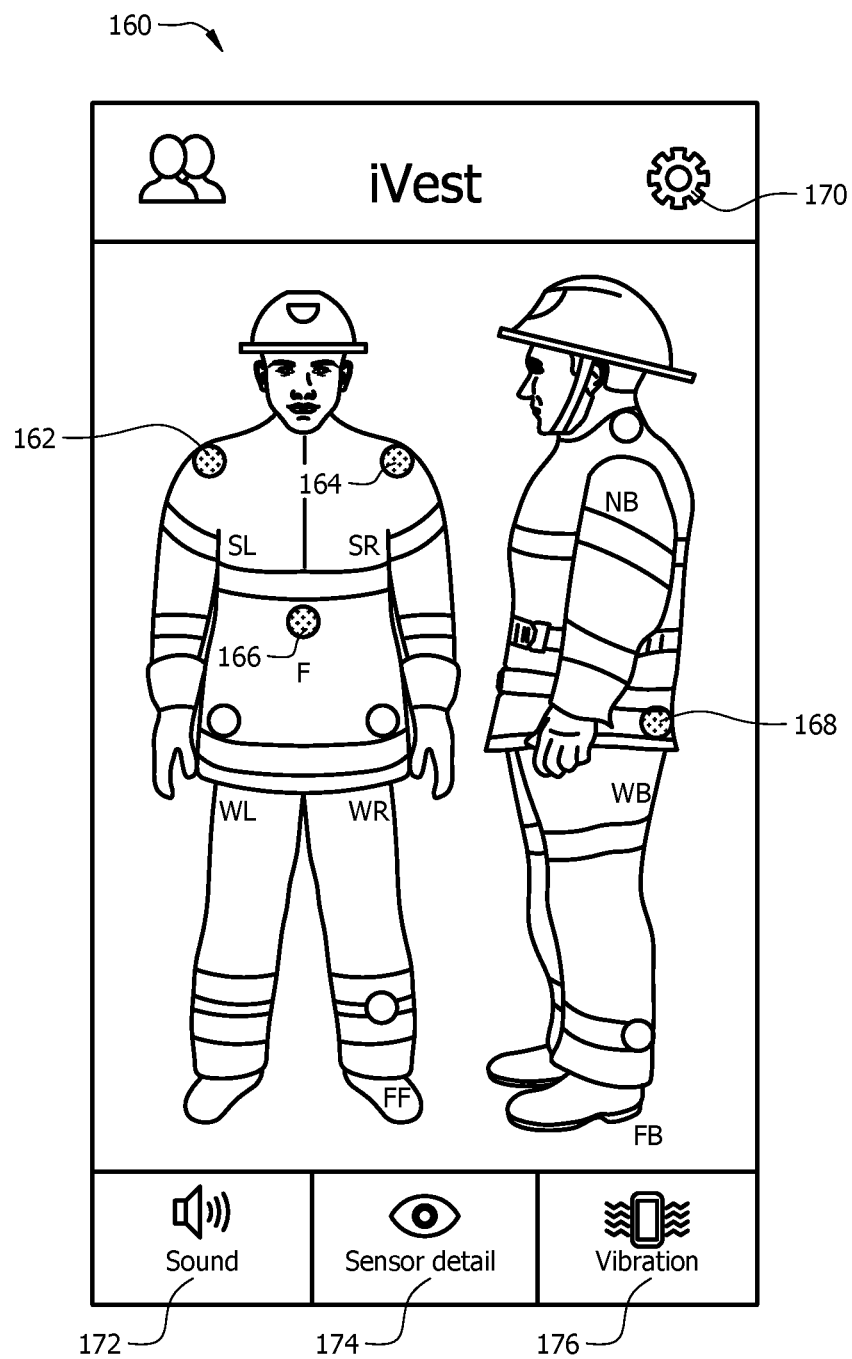
FIG. 3 is an illustration of a user interface according to an embodiment of the disclosure.

Turning now to FIG. 3, a user interface 160 is described. The user interface 160 may be provided by an application that executes on the mobile communication device 146 that provides support for the electric field and/or electro-magnetic field hazard monitoring. The user interface 160 may present a frontal view and a profile view of an abstracted illustration of a worker. The sensors 102, 104, 106, 108 may be depicted in approximate location of the sensors on the vest 100. For example, the first sensor 102 may be illustrated as circle 162, the second sensor 104 may be illustrated as circle 164, the third sensor 106 may be illustrated as circle 166, and the fourth sensor may be illustrated as circle 168. When a sensor 102, 104, 106, 108 experiences a field that exceeds a predefined threshold, the associated sensor illustration 161, 164, 166, or 168 may illuminate, highlight, or flash. It is understood that a first predefined threshold may be configured for an electric field amplitude or intensity threshold and a second predefined threshold may be configured for an electromagnetic field amplitude of intensity.

The user interface 160 may provide a button 170 for accessing setting controls. For example, the setting controls may provide inputs to control a brightness of the user interface 160, to input a threshold of the field amplitude for generating an alert event, to select an aural alert tone, and other controls. A sound button 172 may allow a user to control the volume of the aural alert. A detail button 174 may allow a user to cause more details associated with a selected sensor 102, 104, 106, 108 to be presented, such as a current field strength value. A vibration button 176 may allow a user to turn the vibrate function on or off.

In an embodiment, a method is further disclosed. The method may be implemented by the article of clothing 100 described above with reference to FIG. 1, FIG. 2, and FIG. 3. A processor in an electronic module embedded in the article of clothing selects one of a plurality of sensors coupled to the article of clothing, wherein each sensor is oriented to detect electric and electromagnetic fields in a different direction from the other sensors. In an embodiment, the sensors may be antennas. The electronic module conditions a signal received from the selected sensor. For example, the electronic module may first amplify the signal, second bandpass filter the signal, and third rectify and smooth the signal, as discussed further above. The processor analyzes the conditioned signal. The processor determines that a field incident on the selected sensor exceeds a predefined threshold. Responsive to determining that the incident field exceeds the threshold, the processor causes an alerting device of the electronic module to present an alert indicating a direction of an electrical hazard relative to the orientation of the article of clothing. For example, the alert may indicate that the hazard is generally in front of the article of clothing (regardless of what point of the compass a wearer of the article of clothing may be facing), generally to the left side of the article of clothing, generally to the right side of the article of clothing, or generally to the back of the article of clothing. In an embodiment, the electronic module may further transmit a message via a wireless communication link to a mobile communication device (e.g., mobile communication device 146) that informs an application executing on the device of the alert and the direction of the electrical hazard. In an embodiment, the method may further comprise executing a self-test procedure to verify operation of the electronic module and the sensors.

Figure 4:
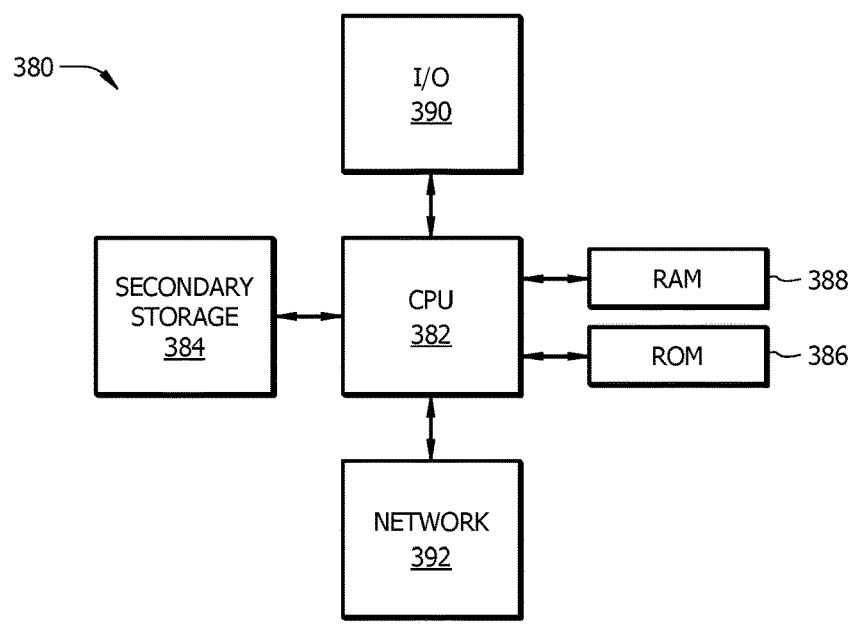
FIG. 4 is a block diagram of a computer system according to an embodiment of the disclosure.

FIG. 4 illustrates a computer system 380 suitable for implementing one or more embodiments disclosed herein. For example, a data analysis server that processes logs or data forwarded by the mobile communication device 146 may be implemented as a computer system. The electronic module 120 may, at least in part, be abstractly viewed as a computer system. The computer system 380 includes a processor 382 (which may be referred to as a central processor unit or CPU) that is in communication with memory devices including secondary storage 384, read only memory (ROM) 386, random access memory (RAM) 388, input/output (I/O) devices 390, and network connectivity devices 392. The processor 382 may be implemented as one or more CPU chips.

It is understood that by programming and/or loading executable instructions onto the computer system 380, at least one of the CPU 382, the RAM 388, and the ROM 386 are changed, transforming the computer system 380 in part into a particular machine or apparatus having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

Additionally, after the system 380 is turned on or booted, the CPU 382 may execute a computer program or application. For example, the CPU 382 may execute software or firmware stored in the ROM 386 or stored in the RAM 388. In some cases, on boot and/or when the application is initiated, the CPU 382 may copy the application or portions of the application from the secondary storage 384 to the RAM 388 or to memory space within the CPU 382 itself, and the CPU 382 may then execute instructions that the application is comprised of. In some cases, the CPU 382 may copy the application or portions of the application from memory accessed via the network connectivity devices 392 or via the I/O devices 390 to the RAM 388 or to memory space within the CPU 382, and the CPU 382 may then execute instructions that the application is comprised of. During execution, an application may load instructions into the CPU 382, for example load some of the instructions of the application into a cache of the CPU 382. In some contexts, an application that is executed may be said to configure the CPU 382 to do something, e.g., to configure the CPU 382 to perform the function or functions promoted by the subject application. When the CPU 382 is configured in this way by the application, the CPU 382 becomes a specific purpose computer or a specific purpose machine.

The secondary storage 384 is typically comprised of one or more disk drives or tape drives and is used for non-volatile storage of data and as an over-flow data storage device if RAM 388 is not large enough to hold all working data. Secondary storage 384 may be used to store programs which are loaded into RAM 388 when such programs are selected for execution. The ROM 386 is used to store instructions and perhaps data which are read during program execution. ROM 386 is a non-volatile memory device which typically has a small memory capacity relative to the larger memory capacity of secondary storage 384. The RAM 388 is used to store volatile data and perhaps to store instructions. Access to both ROM 386 and RAM 388 is typically faster than to secondary storage 384. The secondary storage 384, the RAM 388, and/or the ROM 386 may be referred to in some contexts as computer readable storage media and/or non-transitory computer readable media.

I/O devices 390 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 392 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards that promote radio communications using protocols such as code division multiple access (CDMA), global system for mobile communications (GSM), long-term evolution (LTE), worldwide interoperability for microwave access (WiMAX), near field communications (NFC), radio frequency identity (RFID), and/or other air interface protocol radio transceiver cards, and other well-known network devices. These network connectivity devices 392 may enable the processor 382 to communicate with the Internet or one or more intranets. With such a network connection, it is contemplated that the processor 382 might receive information from the network, or might output information to the network in the course of performing the above-described method steps. Such information, which is often represented as a sequence of instructions to be executed using processor 382, may be received from and outputted to the network, for example, in the form of a computer data signal embodied in a carrier wave.

Such information, which may include data or instructions to be executed using processor 382 for example, may be received from and outputted to the network, for example, in the form of a computer data baseband signal or signal embodied in a carrier wave. The baseband signal or signal embodied in the carrier wave, or other types of signals currently used or hereafter developed, may be generated according to several methods well-known to one skilled in the art. The baseband signal and/or signal embedded in the carrier wave may be referred to in some contexts as a transitory signal.

The processor 382 executes instructions, codes, computer programs, scripts which it accesses from hard disk, floppy disk, optical disk (these various disk based systems may all be considered secondary storage 384), flash drive, ROM 386, RAM 388, or the network connectivity devices 392. While only one processor 382 is shown, multiple processors may be present. Thus, while instructions may be discussed as executed by a processor, the instructions may be executed simultaneously, serially, or otherwise executed by one or multiple processors. Instructions, codes, computer programs, scripts, and/or data that may be accessed from the secondary storage 384, for example, hard drives, floppy disks, optical disks, and/or other device, the ROM 386, and/or the RAM 388 may be referred to in some contexts as non-transitory instructions and/or non-transitory information.

In an embodiment, the computer system 380 may comprise two or more computers in communication with each other that collaborate to perform a task. For example, but not by way of limitation, an application may be partitioned in such a way as to permit concurrent and/or parallel processing of the instructions of the application. Alternatively, the data processed by the application may be partitioned in such a way as to permit concurrent and/or parallel processing of different portions of a data set by the two or more computers. In an embodiment, virtualization software may be employed by the computer system 380 to provide the functionality of a number of servers that is not directly bound to the number of computers in the computer system 380. For example, virtualization software may provide twenty virtual servers on four physical computers. In an embodiment, the functionality disclosed above may be provided by executing the application and/or applications in a cloud computing environment. Cloud computing may comprise providing computing services via a network connection using dynamically scalable computing resources. Cloud computing may be supported, at least in part, by virtualization software. A cloud computing environment may be established by an enterprise and/or may be hired on an as-needed basis from a third party provider. Some cloud computing environments may comprise cloud computing resources owned and operated by the enterprise as well as cloud computing resources hired and/or leased from a third party provider.

In an embodiment, some or all of the functionality disclosed above may be provided as a computer program product. The computer program product may comprise one or more computer readable storage medium having computer usable program code embodied therein to implement the functionality disclosed above. The computer program product may comprise data structures, executable instructions, and other computer usable program code. The computer program product may be embodied in removable computer storage media and/or non-removable computer storage media. The removable computer readable storage medium may comprise, without limitation, a paper tape, a magnetic tape, magnetic disk, an optical disk, a solid state memory chip, for example analog magnetic tape, compact disk read only memory (CD-ROM) disks, floppy disks, jump drives, digital cards, multimedia cards, and others. The computer program product may be suitable for loading, by the computer system 380, at least portions of the contents of the computer program product to the secondary storage 384, to the ROM 386, to the RAM 388, and/or to other non-volatile memory and volatile memory of the computer system 380. The processor 382 may process the executable instructions and/or data structures in part by directly accessing the computer program product, for example by reading from a CD-ROM disk inserted into a disk drive peripheral of the computer system 380. Alternatively, the processor 382 may process the executable instructions and/or data structures by remotely accessing the computer program product, for example by downloading the executable instructions and/or data structures from a remote server through the network connectivity devices 392. The computer program product may comprise instructions that promote the loading and/or copying of data, data structures, files, and/or executable instructions to the secondary storage 384, to the ROM 386, to the RAM 388, and/or to other non-volatile memory and volatile memory of the computer system 380.

In some contexts, the secondary storage 384, the ROM 386, and the RAM 388 may be referred to as a non-transitory computer readable medium or a computer readable storage media. A dynamic RAM embodiment of the RAM 388, likewise, may be referred to as a non-transitory computer readable medium in that while the dynamic RAM receives electrical power and is operated in accordance with its design, for example during a period of time during which the computer system 380 is turned on and operational, the dynamic RAM stores information that is written to it. Similarly, the processor 382 may comprise an internal RAM, an internal ROM, a cache memory, and/or other internal non-transitory storage blocks, sections, or components that may be referred to in some contexts as non-transitory computer readable media or computer readable storage media.

Figure 5:
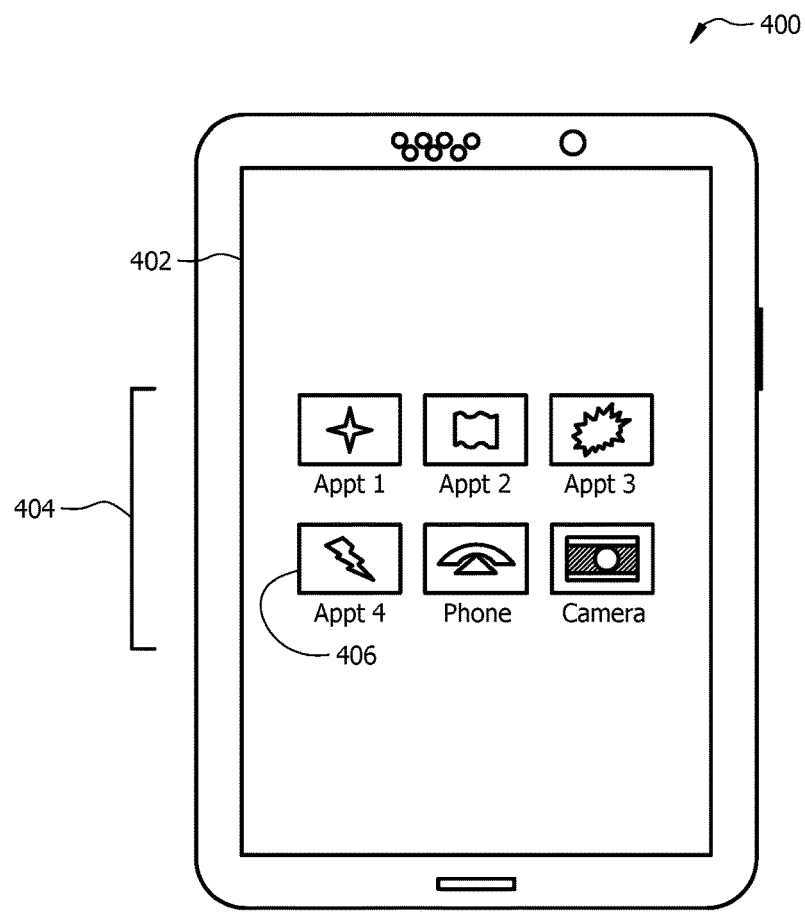
FIG. 5 is an illustration of a mobile communication device according to an embodiment of the disclosure.

FIG. 5 depicts the mobile communication device 400, which is operable for implementing aspects of the present disclosure, but the present disclosure should not be limited to these implementations. Though illustrated as a mobile phone, the mobile device 400 may take various forms including a wireless handset, a pager, a personal digital assistant (PDA), a gaming device, or a media player. The device 400 includes a touchscreen display 402 having a touch-sensitive surface for input by a user. A small number of application icons 404 are illustrated within the touch screen display 402. It is understood that in different embodiments, any number of application icons 404 may be presented in the touch screen display 402. In some embodiments of the mobile device 400, a user may be able to download and install additional applications on the mobile device 400, and an icon associated with such downloaded and installed applications may be added to the touch screen display 402 or to an alternative screen. The mobile device 400 may have other components such as electro-mechanical switches, speakers, camera lenses, microphones, input and/or output connectors, and other components as are well known in the art. The mobile device 400 may present options for the user to select, controls for the user to actuate, and/or cursors or other indicators for the user to direct. The mobile device 400 may further accept data entry from the user, including numbers to dial or various parameter values for configuring the operation of the handset. The mobile device 400 may further execute one or more software or firmware applications in response to user commands. These applications may configure the mobile device 400 to perform various customized functions in response to user interaction. Additionally, the mobile device 400 may be programmed and/or configured over-the-air, for example from a wireless base station, a wireless access point, or a peer mobile device 400. The mobile device 400 may execute a web browser application which enables the touch screen display 402 to show a web page. The web page may be obtained via wireless communications with a base transceiver station, a wireless network access node, a peer mobile device 400 or any other wireless communication network or system.

Figure 6:
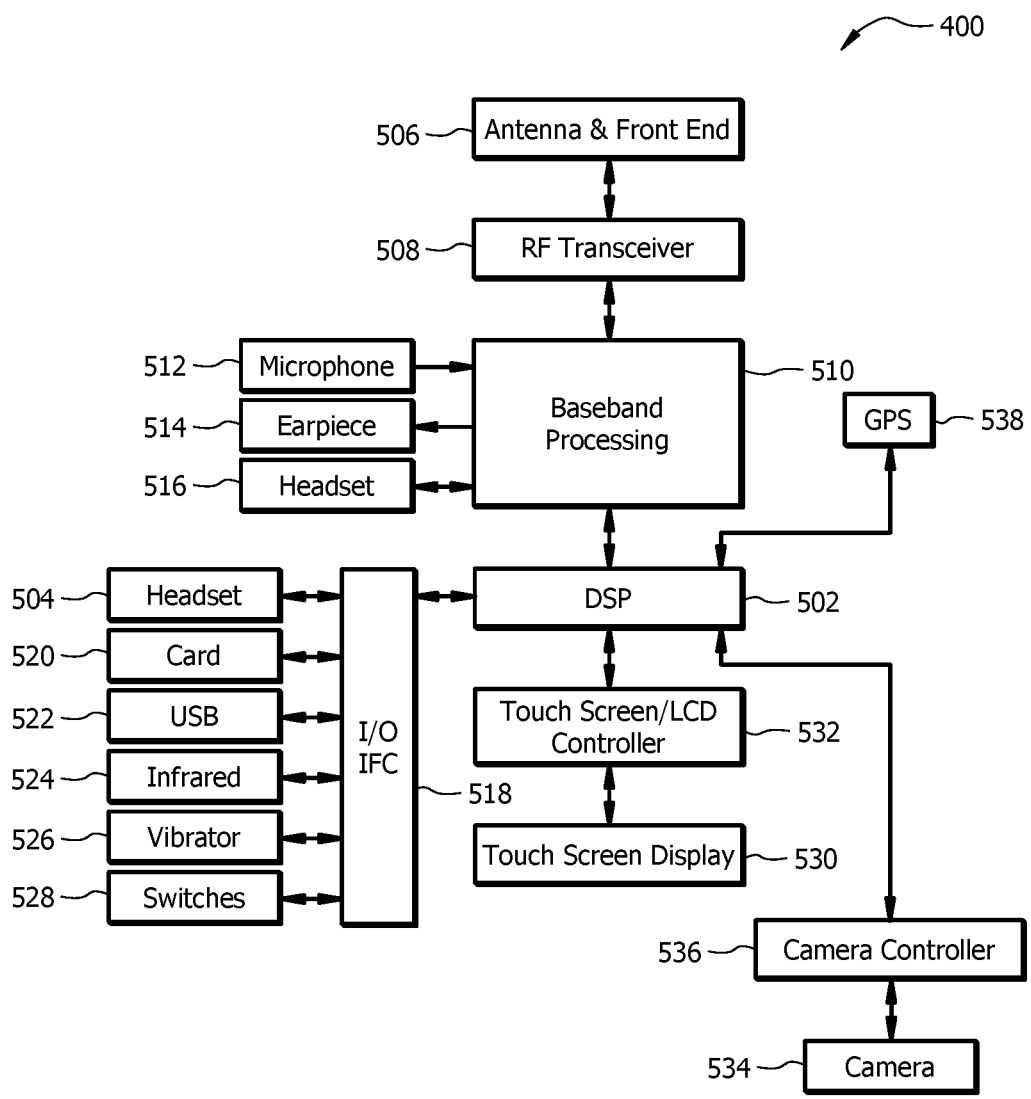
FIG. 6 is a block diagram of a hardware architecture for a mobile communication device according to an embodiment of the disclosure.

FIG. 6 shows a block diagram of the mobile device 400. While a variety of known components of handsets are depicted, in an embodiment a subset of the listed components and/or additional components not listed may be included in the mobile device 400. The mobile device 400 includes a digital signal processor (DSP) 502 and a memory 504. As shown, the mobile device 400 may further include an antenna and front end unit 506, a radio frequency (RF) transceiver 508, a baseband processing unit 510, a microphone 512, an earpiece speaker 514, a headset port 516, an input/output interface 518, a removable memory card 520, a universal serial bus (USB) port 522, an infrared port 524, a vibrator 526, one or more electro-mechanical switches 528, a touch screen liquid crystal display (LCD) with a touch screen display 530, a touch screen/LCD controller 532, a camera 534, a camera controller 536, and a global positioning system (GPS) receiver 538. In an embodiment, the mobile device 400 may include another kind of display that does not provide a touch sensitive screen. In an embodiment, the mobile device 400 may include both the touch screen display 530 and additional display component that does not provide a touch sensitive screen. In an embodiment, the DSP 502 may communicate directly with the memory 504 without passing through the input/output interface 518. Additionally, in an embodiment, the mobile device 400 may comprise other peripheral devices that provide other functionality.

The DSP 502 or some other form of controller or central processing unit operates to control the various components of the mobile device 400 in accordance with embedded software or firmware stored in memory 504 or stored in memory contained within the DSP 502 itself. In addition to the embedded software or firmware, the DSP 502 may execute other applications stored in the memory 504 or made available via information carrier media such as portable data storage media like the removable memory card 520 or via wired or wireless network communications. The application software may comprise a compiled set of machine-readable instructions that configure the DSP 502 to provide the desired functionality, or the application software may be high-level software instructions to be processed by an interpreter or compiler to indirectly configure the DSP 502.

The DSP 502 may communicate with a wireless network via the analog baseband processing unit 510. In some embodiments, the communication may provide Internet connectivity, enabling a user to gain access to content on the Internet and to send and receive e-mail or text messages. The input/output interface 518 interconnects the DSP 502 and various memories and interfaces. The memory 504 and the removable memory card 520 may provide software and data to configure the operation of the DSP 502. Among the interfaces may be the USB port 522 and the infrared port 524. The USB port 522 may enable the mobile device 400 to function as a peripheral device to exchange information with a personal computer or other computer system. The infrared port 524 and other optional ports such as a Bluetooth interface or an IEEE 802.11 compliant wireless interface may enable the mobile device 400 to communicate wirelessly with other nearby handsets and/or wireless base stations. In an embodiment, the mobile device 400 may comprise a near field communication (NFC) transceiver. The NFC transceiver may be used to complete payment transactions with point-of-sale terminals or other communications exchanges. In an embodiment, the mobile device 400 may comprise a radio frequency identify (RFID) reader and/or writer device.

The switches 528 may couple to the DSP 502 via the input/output interface 518 to provide one mechanism for the user to provide input to the mobile device 400. Alternatively, one or more of the switches 528 may be coupled to a motherboard of the mobile device 400 and/or to components of the mobile device 400 via a different path (e.g., not via the input/output interface 518), for example coupled to a power control circuit (power button) of the mobile device 400. The touch screen display 530 is another input mechanism, which further displays text and/or graphics to the user. The touch screen LCD controller 532 couples the DSP 502 to the touch screen display 530. The GPS receiver 538 is coupled to the DSP 502 to decode global positioning system signals, thereby enabling the mobile device 400 to determine its position.

Figure 7A:
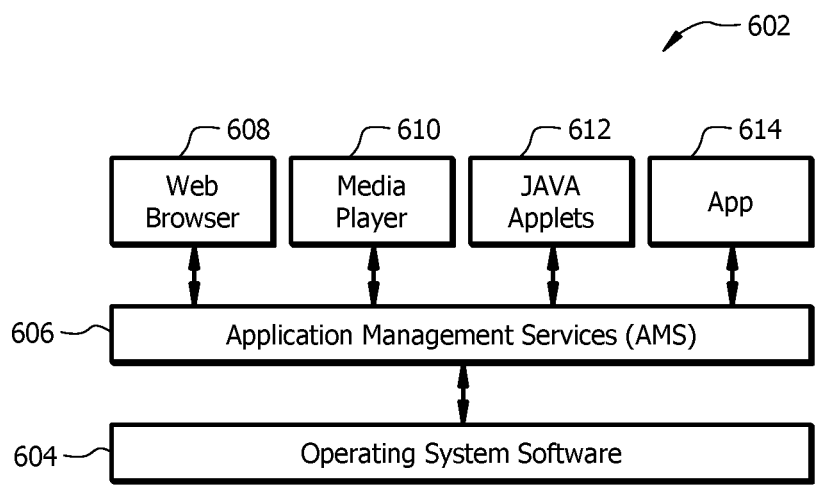
FIG. 7A is a block diagram of a software architecture for a mobile communication device according to an embodiment of the disclosure.

FIG. 7A illustrates a software environment 602 that may be implemented by the DSP 502. The DSP 502 executes operating system software 604 that provides a platform from which the rest of the software operates. The operating system software 604 may provide a variety of drivers for the handset hardware with standardized interfaces that are accessible to application software. The operating system software 604 may be coupled to and interact with application management services (AMS) 606 that transfer control between applications running on the mobile device 400. Also shown in FIG. 7A are a web browser application 608, a media player application 610, JAVA applets 612 and App 614. The web browser application 608 may be executed by the mobile device 400 to browse content and/or the Internet, for example when the mobile device 400 is coupled to a network via a wireless link. The web browser application 608 may permit a user to enter information into forms and select links to retrieve and view web pages. The media player application 610 may be executed by the mobile device 400 to play audio or audiovisual media. The JAVA applets 612 may be executed by the mobile device 400 to provide a variety of functionality including games, utilities, and other functionality.

Figure 7B:
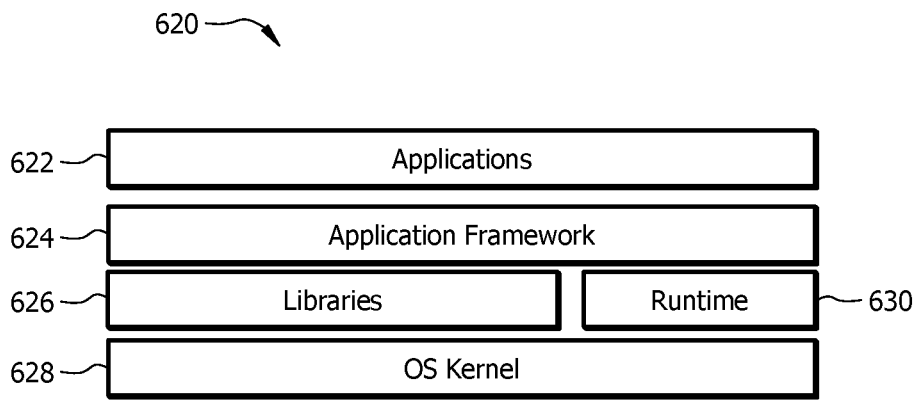
FIG. 7B is a block diagram of another software architecture for a mobile communication device according to an embodiment of the disclosure.

FIG. 7B illustrates an alternative software environment 620 that may be implemented by the DSP 502. The DSP 502 executes operating system kernel (OS kernel) 628 and an execution runtime 630. The DSP 502 executes applications 622 that may execute in the execution runtime 630 and may rely upon services provided by the application framework 624. Applications 622 and the application framework 624 may rely upon functionality provided via the libraries 626.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. An article of clothing providing detection of electrical hazard detection and alerting, comprising:
   a plurality of sensors, wherein each sensor is configured to interact with at least one of an electric field or an electromagnetic field, is coupled to the article of clothing, and is oriented to a direction different than that of the other sensors; and
   an electronic module communicatively coupled to the sensors, wherein the electronic module comprises:
   at least one alerting device;
   a multiplexer configured to pass a signal from one sensor at a time; and
   a processor configured to:
      select sensor signals via the multiplexer,
      analyze an amplitude of at least one of an electric field or an amplitude of an electromagnetic field incident on the selected sensor,
      determine at least one of when the amplitude of the electric field exceeds a predefined electric field threshold or when the electromagnetic field exceeds a predefined electromagnetic field threshold, and
      activate the alerting device when one of the amplitude of the electric field exceeds the predefined electric field threshold or the amplitude of the electromagnetic field exceeds the predefined electromagnetic field, wherein the alerting device indicates the direction to which the sensor associated with the exceeding field is oriented.

2. The article of clothing of claim 1, further comprising a radio transceiver coupled to the processor, wherein the processor is further configured to transmit a message about the direction to which the sensor associated with the exceeding field is oriented.

3. The article of clothing of claim 1, wherein the sensors comprise an antenna.

4. The article of clothing of claim 1, wherein the sensors comprise a first sensor that is oriented towards a front of the article of clothing and a second sensor that is oriented towards a back of the article of clothing.

5. The article of clothing of claim 4, wherein the sensors further comprise a third sensor that is oriented towards a right side of the article of clothing and a fourth sensor that is oriented towards a left side of the article of clothing.

6. The article of clothing of claim 1, wherein the electronic module further comprises a signal conditioning block that provides a conditioned signal to the processor that the processor analyzes to determine when the predefined electric signal threshold has been exceeded and when the predefined electromagnetic field threshold has been exceeded.

7. The article of clothing of claim 1, wherein the electronic module further comprises a signal conditioning block that provides a signal to the processor that indicates when the predefined electric signal threshold has been exceeded and when the predefined electromagnetic field threshold has been exceeded.

8. The article of clothing of claim 7, wherein the signal conditioning block amplifies the signal passed from a sensor selected by the multiplexer, bandpass filters the amplified signal, and threshold detects the filtered signal.

9. The article of clothing of claim 1, wherein the processor logs field strengrth reading and stores them with a time and date.

10. The article of clothing of claim 1, wherein the processor is configured to respond to a control input by executing a self-test mode that activates the at least one alerting device.

11. The article of clothing of claim 1, wherein the at least one alerting device comprises an aural alerting device.

12. The article of clothing of claim 1, wherein the at least one alerting device comprises a visual alerting device.

13. An article of clothing providing electrical hazard detection and alerting, comprising:
    four antennas, Wherein each antenna is configured to interact with at least one of an electric field or an electromagnetic field, is coupled to the article of clothing, and is oriented to a different direction than the other antennas; and
    an electronic module communicatively coupled to the antennas, wherein the electronic module comprises:
    an aural alerting device;
    a visual alerting device that is configured to indicate a direction of an electrical hazard relative to the orientation of the article of clothing;
    a multiplexer to pass a signal from one antenna at a time; and
    a processor configured to:
       select antenna signals via the multiplexer,
       analyze an amplitude of at least one of an electric field or an amplitude of an electromagnetic field incident on the selected antenna,
       determine at least one of when the amplitude of the electric field exceeds a predefined electric field threshold or when the electromagnetic field exceeds a predefined electromagnetic field threshold,
       activate the aural alerting device when at least one of the amplitude of the electric field exceeds the predefined electric field threshold or the amplitude of the electromagnetic field exceeds the predefined electromagnetic field, and cause the visual alerting device to indicate the direction of the electrical hazard when one of the amplitude of the electric field exceeds the predefined electric field threshold or the amplitude of the electromagnetic field exceeds the predefined electromagnetic field.

14. The article of clothing of claim 13, wherein a first antenna is oriented towards a front the article of clothing, a second antenna is oriented towards a back of the article of clothing, a third antenna is oriented towards a right of the article of clothing, and a fourth antenna is oriented towards a left of the article of clothing.

15. The article of clothing of claim 13, wherein the processor supports a self-test mode to test function of the aural alerting device and the visual alerting device.

16. The article of clothing of claim 13, wherein the processor is configured to log readings of field strength and associate the logs with a time and date.

17. The article of clothing of claim 16, wherein the processor is configured to periodically transmit the logs of field strength to one of a mobile communication device or a server computer.

18. A method of detecting and alerting electrical hazard direction, the method comprising:

selecting, by a processor of an electronic module coupled to an article of clothing, one of a plurality of sensors coupled to the article of clothing, wherein each sensor is oriented to detect electric and electromagnetic fields in a different direction from the other sensors;

conditioning, by the electronic module, a signal received from the selected sensor;

analyzing, by the processor, the conditioned signal;

determining, by the processor, that a field incident on the selected sensor exceeds a predefined threshold; and causing, by the processor, an alerting device of the electronic module to present an alert indicating a direction of an electrical hazard relative to the orientation of the article of clothing.

19. The method of claim 18, wherein conditioning the signal received from the selected sensor comprises amplifying the signal and bandpass filtering the amplified signal.

20. The method of claim 18, further comprising conducting a self-test, by the processor, in response to receiving a self-test activation command, wherein the processor causes the alerting device to present the alert as part of the self-test.

* * * * *